United States Patent [19]

Watanabe

[11] Patent Number: 4,737,838
[45] Date of Patent: Apr. 12, 1988

[54] CAPACITOR BUILT-IN SEMICONDUCTOR INTEGRATED CIRCUIT AND PROCESS OF FABRICATION THEREOF

[75] Inventor: Tokujiro Watanabe, Tokyo, Japan

[73] Assignee: NEC Corporation, Japan

[21] Appl. No.: 823,609

[22] Filed: Jan. 29, 1986

[30] Foreign Application Priority Data

Jan. 30, 1985 [JP] Japan .................... 60-15874

[51] Int. Cl.⁴ .................. H01L 27/02; H01L 23/48
[52] U.S. Cl. .................... 357/51; 357/23.6; 357/59; 357/65; 357/68
[58] Field of Search ............ 357/23.6, 51, 59, 65, 357/68; 361/301

[56] References Cited

U.S. PATENT DOCUMENTS 4,285,001  8/1981  Gerzberg et al. ............ 357/23.6
4,419,812 12/1983  Topich ........................ 357/51

FOREIGN PATENT DOCUMENTS 54-260285 12/1979 Japan ...................... 357/51
60-211866 10/1985 Japan ...................... 357/51

Primary Examiner—J. Carroll
Attorney, Agent, or Firm—Laff, Whitesel, Conte & Saret

[57] ABSTRACT

A semiconductor integrated circuit comprising a capacitor device including a first conductive layer on a semiconductor substrate, an insulating layer on the first conductive layer and a second conductive layer of polysilicon on the insulating layer, an outer insulating layer covering the second conductive layer and formed with a plurality of openings each of which extends to the surface of the second conductive layer, and a metal layer formed on the outer insulating layer, the metal layer having portions contacting the second conductive layer respectively through the openings in the outer insulating layer.

6 Claims, 5 Drawing Sheets

CAPACITOR BUILT-IN SEMICONDUCTOR INTEGRATED CIRCUIT AND PROCESS OF FABRICATION THEREOF

FIELD OF THE INVENTION

The present invention relates to a semiconductor integrated circuit structure and, more particularly, to a semiconductor integrated circuit structure having a built-in capacitor.

BACKGROUND OF THE INVENTION

A typical example of a known semiconductor integrated circuit having a built-in capacitor is illustrated in FIGS. 1 and 2. The semiconductor integrated circuit herein shown includes a semiconductor substrate 10 having a relatively thick insulating layer 12 formed on the surface thereof. On the surface of the insulating layer 12 in turn is formed a polysilicon conductive layer 14 which is in part covered with a relatively thin polysilicon oxide film 16. The polysilicon oxide film 16 in turn partly underlies a polysilicon conductive layer 18. The lower polysilicon conductive layer 14 and the upper polysilicon conductive layer 18 form part of a built-in capacitor 20 which has a dielectric layer formed by the thin polysilicon oxide film 16 intervening between the electrode plates formed by the two conductive layers 14 and 18. The exposed portions of the polysilicon oxide film 16 and the upper polysilicon conductive layer 18 are covered with an insulating layer 22 which is formed with contact holes or openings 24 and 26. One contact hole 24 extends to the surface of the lower polysilicon conductive layer 14 and the other contact hole or opening 26 extends to the surface of the upper polysilicon conductive layer 18. The contact hole 24 and opening 26 are formed typically by photoetching techniques using an etchant of hydrofluoric acid. On the upper polysilicon conductive layer 18 and the toplevel insulating layer 22 are deposited wiring metal layers which include a metal layer 28 contacting the surface of the lower polysilicon conductive layer 14 through the contact opening 26 and a metal layer 30 overlying the surface of the upper polysilicon conductive layer 18 through the opening 26 in the insulating layer 22. Each of these wiring metal layers 28 and 30 is typically of aluminum. The capacitor 20 thus formed in the semiconductor integrated circuit has its lower polysilicon conductive layer 14 isolated from the semiconductor substrate 10 by means of the thick insulating layer 12 and for this reason provides a sufficiently small capacitance which makes the capacitor less susceptible to the potential on the substrate 10.

The semiconductor integrated circuit having such a capacitor 20 formed therein however has a drawback in that the contact opening 26 to receive the wiring metal layer 30 for the upper polysilicon conductive layer 18 is so spacious that contact spiking tends to take place between the polysilicon conductive layer 18 and the metal layer 30. During a high-temperature process step which is used to improve the ohmic contact between the conductive layer 18 and the metal layer 30 which is usually of aluminum, a large quantity of aluminum is caused to sink into the underlying polysilicon conductive layer 18 and impedes formation of proper ohmic contact between the layers 18 and 30. The aluminum spike may even penetrates through the polysilicon conductive layer 18 into the polysilicon oxide film 16 and may thus damage the oxide film 16.

Another problem results from the use of an etchant of hydrofluoric acid during etching of the insulating layer 22 for the formation of the contact hole and opening 24 and 26. Not only the insulating layer 22 but also the upper polysilicon conductive layer 18 are subjected to the attack of the etchant of hydrofluoric acid during this etching step. A small quantity of hydrofluoric acid is thus allowed into the conductive layer 18 through the boundaries between the polysilicon crystals forming the layer 18 and may reach the underlying polysilicon oxide film 16. This, again, may cause damage to the polysilicon oxide film 18. The larger the area of the contact opening 26 in the insulating layer 22, the more serious the damage thus caused to the oxide film 18 by the attack of hydrofluoric acid will be. It is however desirable that the contact opening 26 in the insulating layer 22 be as large in area as possible to reduce the contact resistance and provide uniformity of field between the upper polysilicon conductive layer 18 and the metal layer 30 thereon.

The present invention contemplates elimination of these problems which have thus far been inherent in semiconductor integrated circuits incorporating built-in capacitor devices.

SUMMARY OF THE INVENTION

In accordance with one outstanding aspect of the present invention, there is provided a semiconductor integrated circuit comprising (1) a capacitor device including a first conductive layer on a semiconductor substrate, an insulating layer on the first conductive layer and a second conductive layer of polysilicon on the insulating layer, (2) an insulating layer covering the second conductive layer and formed with a plurality of openings each extending to the surface of the second conductive layer, and (3) a metal layer formed on the insulating layer on the second conductive layer, the metal layer having portions contacting the second conductive layer respectively through the openings in the insulating layer on the second conductive layer.

In accordance with another outstanding aspect of the present invention, there is provided a process of fabricating a semiconductor integrated circuit structure including a capacitor device formed therein comprising, (1) preparing a semiconductor substrate of a predetermined conductivity type, (2) forming a relatively thick oxide layer on the substrate, (3) forming a first conductive layer on the relatively thick oxide layer, (4) forming a relatively thin oxide film on the first conductive layer, (5) forming a second conductive layer of polysilicon on this relatively thin oxide film for thereby providing the capacitor device composed of the first conductive layer, the insulating layer on the first conductive layer and the second conductive layer of polysilicon, (6) forming an outer insulating layer on the entire surface of the resultant structure, (7) patterning and etching the outer insulating layer for forming therein contact holes including a plurality of contact holes extending to the surface of the second conductive layer, and (8) forming a metal layer having a plurality of lug portions contacting the second conductive layer respectively through the contact holes extending to the surface of the second conductive layer.

In accordance with still another outstanding aspect of the present invention, there is provided a process of fabricating a semiconductor integrated circuit structure including a capacitor device and a MOS device formed therein comprising, (1) preparing a semiconductor substrate of a first conductivity type, (2) forming a channel stop region in the substrate adjacent an active region to form the MOS device, (3) forming a relatively thick oxide layer on the substrate, the oxide layer in part overlying the channel stop region, (4) forming a relatively thin gate oxide film on the exposed surface portion of the substrate adjacent the relatively thick oxide layer, (5) forming a first conductive layer on the relatively thick oxide layer and a gate region on the gate oxide film, (6) forming a relatively thin oxide film on the first conductive layer, (7) forming a second conductive layer of polysilicon on this relatively thin oxide film for thereby providing the capacitor device composed of the first conductive layer, the insulating layer on the first conductive layer and the second conductive layer of polysilicon, (8) injecting a dopant of the first conductivity type into the second conductive layer control the sheet resistance of the layer to a predetermined value, (9) injecting a dopant of a second conductivity type into the active region of the substrate outside the gate region for producing source and drain regions in the substrate for thereby providing the MOS transistor composed of the gate region and the source and drain regions, the second conductivity type being opposite to the first conductivity type, (10) forming an outer insulating layer on the entire surface of the resultant structure, (11) patterning and etching the outer insulating layer for forming therein contact holes including a plurality of contact holes extending to the surface of the second conductive layer and contact holes extending to the surfaces of the source and drain regions, respectively, of the substrate, and (12) forming a metal layer having a plurality of lug portions contacting the second conductive layer respectively through the contact holes extending to the surface of the second conductive layer, and metal layers contacting the source and drain regions of the substrate respectively through the contact holes extending to the surfaces of the source and drain regions, respectively, of the substrate.

BRIEF DESCRIPTION OF THE DRAWINGS

The features and advantages of a capacitor built-in semiconductor integrated circuit according to the present invention will be more clearly appreciated from the following description taken in conjunction with the accompanying drawings in which like reference numerals designate similar or corresponding units and elements and in which.

DESCRIPTION OF THE PREFERRED EMBODIMENTS

Figure 1:
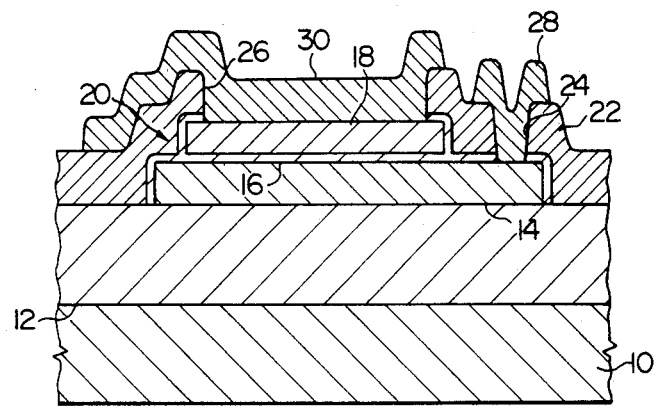
FIG. 1 is a fragmentary cross sectional view showing a typical example of a known semiconductor integrated circuit having a built-in capacitor.
Figure 2:
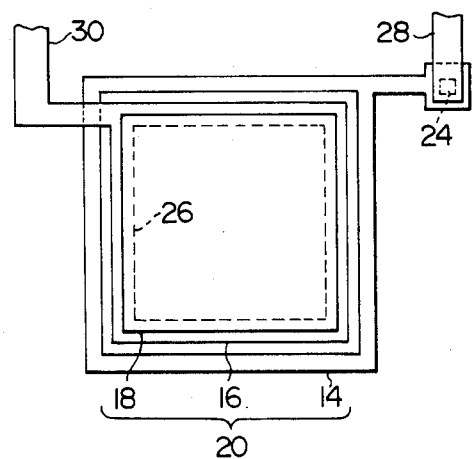
FIG. 2 is a schematic plan view of the semiconductor integrated circuit shown in FIG. 1.
Figure 3:
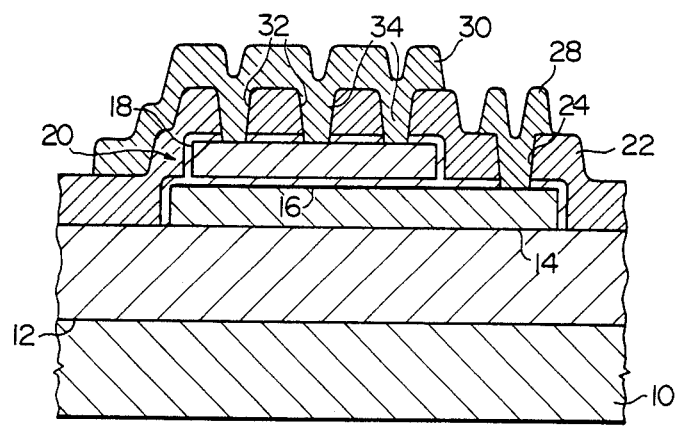
FIG. 3 is a view similar to FIG. 1 but shows a first preferred embodiment of a capacitor built-in semiconductor integrated circuit structure according to the present invention.
Figure 4:
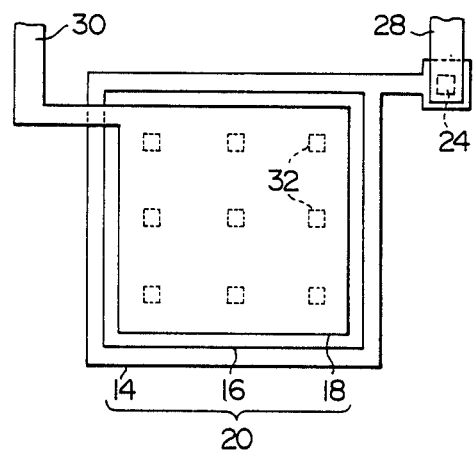
FIG. 4 is a schematic plan view of the semiconductor integrated circuit structure shown in FIG. 3.

Referring to FIG. 3, a first preferred embodiment of a capacitor built-in semiconductor integrated circuit structure according to the present invention also comprises a semiconductor substrate 10 having a relatively thick insulating layer 12 formed on the major surface thereof. On the surface of the insulating layer 12 in turn is formed a polysilicon conductive layer 14 which is in part covered with a relatively thin polysilicon oxide film 16. These conductive layer 14 and oxide film 16 are assumed by way of example as being patterned to form generally square-shaped regions as will be better seen from FIG. 4 but may be otherwise shaped if desired. The polysilicon oxide film 16 in turn partly underlies a polysilicon conductive layer 18. This upper polysilicon conductive layer 18 is assumed to be patterned to form a largely square-shaped region which is smaller in area than the underlying polysilicon conductive layer 14 and oxide film 16 as will be also seen from FIG. 4. As in the prior-art integrated circuit structure described with reference to FIGS. 1 and 2, the lower polysilicon conductive layer 14 and the upper polysilicon conductive layer 18 of the structure herein shown form part of a built-in capacitor device 20 which has a dielectric layer formed by the thin polysilicon oxide film 16 intervening between the two conductive layer conductive layers 14 and 18. Those portions of the polysilicon oxide film 16 and the upper polysilicon conductive layer 18 which remain exposed at this stage are covered with an insulating layer 22 which is formed with a contact hole 24 extending to the surface of the lower polysilicon conductive layer 14.

In the shown embodiment of a semiconductor integrated circuit structure according to the present invention, the insulating layer 22 is further formed with a plurality of contact holes 32 which extend to the surface of the upper polysilicon conductive layer 18. The contact holes 32 thus formed in the insulating layer 22 are disposed in rows and columns or otherwise distributed substantially uniformly over the upper polysilicon conductive layer 18 as will be seen from FIG. 4. As will be further seen from FIG. 4, each of the contact holes 32 preferably has a generally square-shaped cross section measuring from about 1×1 square micron to about 4×4 square microns. These contact holes 32 as well as the above mentioned contact hole 24 are formed typically by photoetching techniques using an etchant of hydrofluoric acid. On the upper polysilicon conductive layer 18 and the toplevel insulating layer 22 thus formed with the contact holes 24 and 32 are deposited wiring metal layers which include a metal layer 28 contacting the surface of the lower polysilicon conductive layer 14 through the contact hole 26 and a metal layer 30 having a plurality of lug portions 34. The lug portions 34 pass through the contact holes 32, respectively, and reach the surface of the conductive layer 14, thus contacting the conductive layer 14 at their bottom ends. Each of these wiring metal layers 28 and 30 is typically of aluminum.

The number and locations of the contact holes 32 to be provided in the insulating layer 22 may vary depending upon the desired capacitance and accordingly upon the desired area of the upper polysilicon conductive layer. Where each of the contact holes 32 measures from about 1×1 square micron to about 4×4 square microns as above noted, it is desirable that such contact holes be provided each for a unit area of the insulating layer 22 measuring from about 10×10 square microns to about 100×100 square microns. Such distribution of the contact holes 32 will provide a proper contact resistance and uniformity of field between the upper polysilicon conductive layer 18 and the metal layer 30 thereon, thereby providing a sufficiently stable capacitance in response to signals of any frequencies.

FIGS. 5A to 5E show a series of process steps to be performed to fabricate a semiconductor integrated circuit structure which has incorporated therein a silicon-gate MOS (metal oxide semiconductor) transistor in addition to a capacitor formed in accordance with the present invention. It may be noted that the semiconductor integrated circuit structure to be fabricated by this process constitutes a second preferred embodiment of a capacitor built-in semiconductor integrated circuit structure according to the present invention.

Figure 5D:
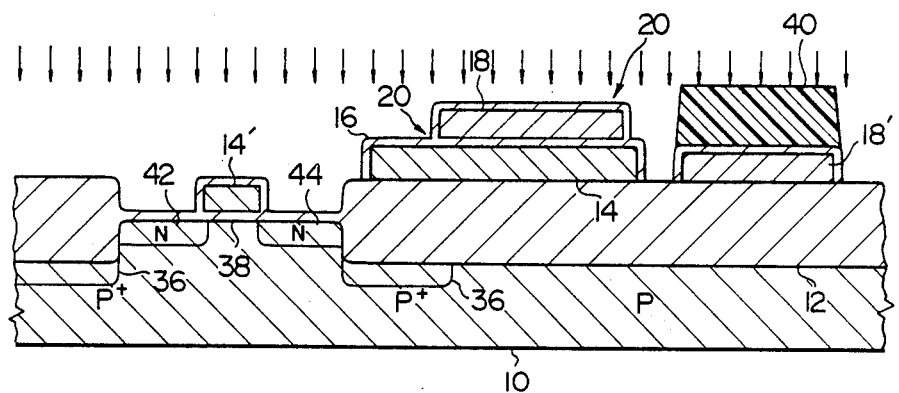
FIGS. 5A to 5E are fragmentary cross sectional views showing a series of process steps to be performed to fabricate a capacitor built-in semiconductor integrated circuit structure which has a silicon-gate n-channel MOS device incorporated therein, the integrated circuit structure per se constituting a second preferred embodiment of a semiconductor integrated circuit structure according to the present invention.
Figure 5E:
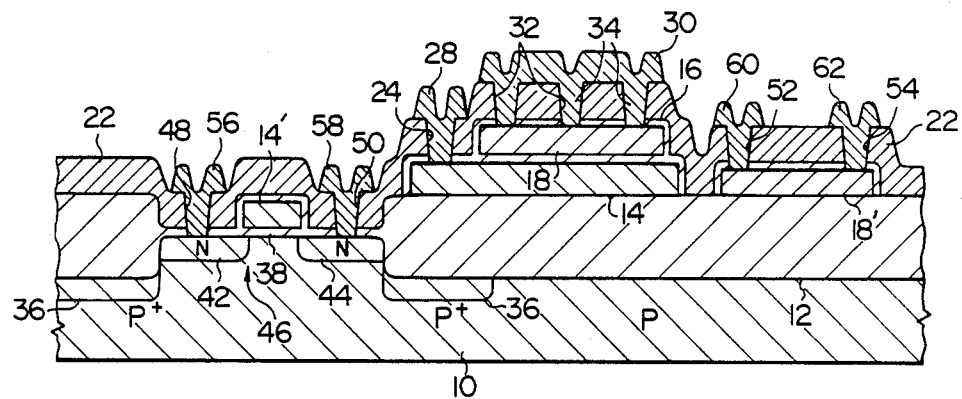
Figure 5A:
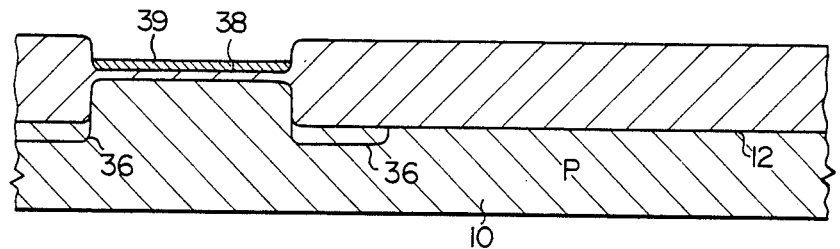

Referring first to FIG. 5A, the process to fabricate such a semiconductor integrated circuit structure starts with the preparation of a semiconductor substrate 10 of, for example, p-type silicon. Channel stop regions are formed in this silicon substrate 10 by an ordinary LOCOS (local oxidation of silicon) process. For this purpose, the silicon substrate 10 is thermally oxidized to form a thin oxide film underneath the surface of the substrate 10, followed by deposition of a film 39 of silicon nitride. The silicon nitride film 39 is patterned and etched by ordinary lithographic techniques to define the active region of the transistor to be formed on the silicon oxide film. A suitable p-type dopant such as boron is then implanted into the silicon substrate 10 with the remaining film 39 of silicon nitride (and the layer of resist thereon) used as a mask, thus forming $p^+$-type channel stop regions 36 to preselected depths in the substrate 10 as shown. Further using the remaining film 39 of silicon nitride as a mask, a relatively thick oxide layer 12 is then grown on the silicon substrate 10 typically in the atmosphere of steam. This oxide layer forms not only a field oxide layer for the MOS transistor to be fabricated but also the insulating layer to form part of the capacitor to be fabricated. After the oxide layer 12 is thus formed, the films of the silicon oxide and nitride remaining on the surface of the substrate 10 are stripped off and a relatively thin gate oxide film 38 is grown to a thickness of, for example, about 400 Angstroms on the exposed surface portion of the substrate 10. FIG. 5A shows the configuration of the resultant silicon structure.

Figure 5B:
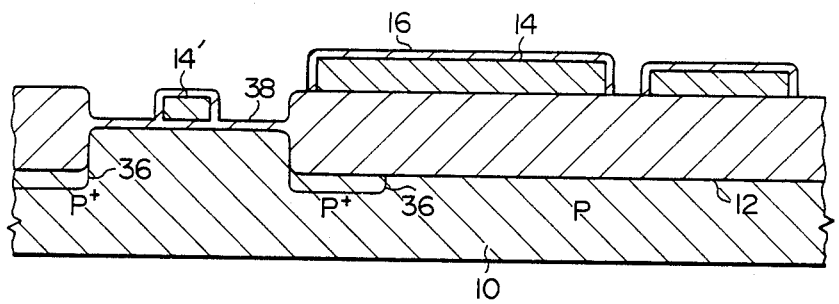

On the structure thus obtained is epitaxially grown a conformal polysilicon layer to a thickness of, for example, 6000 Angstroms, which is then patterned and etched to form a lower conductive layer 14 on the insulating layer 12 and a gate region 14' on the gate oxide film 38. After the resist used as a mask for the formation of these polysilicon regions is stripped off, a relatively thin oxide film is grown on the surface of the resultant structure in the atmosphere of steam or dry oxygen gas to form a polysilicon oxide film 16 on the the conductive layer 14. The configuration of the structure as a result of this oxidation step is shown in FIG. 5B.

Figure 5C:
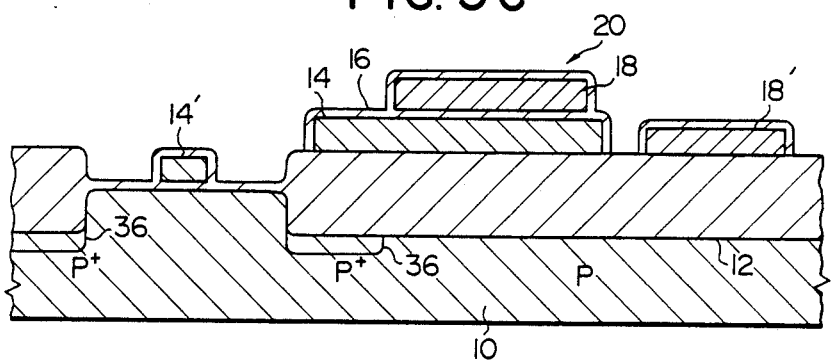

Another polysilicon layer is then epitaxially grown to a thickness of, for example, 3000 Angstroms on the structure thus obtained. Boron is implanted into this second polysilicon layer to control the sheet resistance of the layer to a predetermined value ranging from, for example, about 100 ohms per square to about 1 megohms per square. The implanted polysilicon layer is patterned and etched to form an upper conductive layer 18 selectively on the surface of the oxide film 16 as shown in FIG. 5C. If desired, the polysilicon layer to form the upper conductive layer 18 for the capacitor to be fabricated may be patterned to form an additional conductive layer 18' to provide a resistor in addition to the capacitor and MOS transistor on the substrate 10. After the resist used as a mask for the formation of this conductive layer 18 is removed, a relatively thin oxide film may be grown on the surface of the resultant structure. FIG. 5C shows the configuration of the structure as a result of this oxidation step. As described previously, the lower and upper polysilicon conductive layers 14 and 18 of the structure thus produced form part of a built-in capacitor device 20 having a dielectric layer formed by the thin polysilicon oxide film 16 between the two conductive layers 14 and 18.

A resist film is then spun onto the structure and is patterned and etched to form a mask 40 selectively on the conductive layer 18' to fabricate the resistor as shown in FIG. 5D. A suitable n-type dopant such as arsenide or phosphorus is implanted into the entire structure with the exception of the area covered with the mask 40. Source and drain regions 42 and 44 are thus formed in the silicon substrate 10 on both sides of the gate region 14'. A silicon-gate MOS transistor 46 is now formed by these gate, source and drain regions 14', 42 and 44. This implant step is useful not only for the formation of the source and drain regions 42 and 44 of the MOS transistor 46 but for improving the conductivity of the upper polysilicon conductive layer 18 of the capacitor 20. Upon completion of the implant, the mask 40 is stripped off.

An insulating layer 22 of silicon oxide or phosphosilicate glass (PSG) is then deposited on the entire surface of the resultant structure to a thickness of about 10,000 Angstroms by, for example, CVD (chemical vapor deposition) techniques. The insulating layer 22 thus formed is patterned and etched to form various contact holes in the layer 22. As shown in FIG. 5E, thes contact holes include a contact hole 24 extending to the surface of the lower polysilicon conductive layer 14 through the insulating layer 22 and polysilicon oxide film 16, and a plurality of contact holes 32 extending to the surface of the upper polysilicon conductive layer 18 through the insulating layer 22. As discussed previously, the contact holes 32 provided over the capacitor 20 are disposed in rows and columns or otherwise distributed substantially uniformly over the upper polysilicon conductive layer 18. The contact holes formed in the insulating layer 22 further include two contact holes 48 and 50 extending to the surfaces of the source and drain regions 42 and 44, respectively, of the silicon substrate 10 through the insulating layer 22 and two contact holes 52 and 54 extending through the insulating layer 22 to the surface of the conductive layer 18' forming the resistor. A conformal metal layer of, typically, aluminum is now deposited on the entire surface of the resultant structure with use of an electron-gun deposition method or an appropriate sputtering process. The metal layer is patterned and etched by ordinary photolithographic techniques to leave a metal layer 28 contacting the surface of the lower polysilicon conductive layer 14 through the contact hole 26 and a metal layer 30 having a plurality of lug portions 34 passing through the contact holes 32, respectively, and reaching the surface of the conductive layer 14. Also left are metal layers 56 and 58 contacting the source and drain regions 42 and 44 of the substrate 10 through the contact holes 48 and 50, respectively, and metal layers 60 and 62 contacting the conductive layer 18' forming the resistor through the contact holes 48 and 50. FIG. 5E shows the resultant structure of the semiconductor integrated circuit having the capacitor 20, silicon-gate n-channel MOS transistor 46 and resistor 18' formed on the silicon substrate 10.

The etching process to form the holes 24, 32, 48, 50, 52 and 54 in the insulating layer 22 as discussed above may consist of a dry etching process such as a reactive ion etching (RIE) step to roughly form the holes and a wet etching step using an etchant of hydrofluoric acid to clean the damage and contamination resulting from the dry etching step. A small quantity of hydrofluoric acid may remain in each of these contact holes after the structure is cleaned. Such residues of the hydrofluoric acid etchant would however cause no such serious problems as would result in deterioration of the dielectric strength characteristics of the capacitor 20.

As will have been understood from the foregoing description, a capacitor built-in semiconductor integrated circuit structure according to the present invention is characterized inter alia by the formation of a plurality of relatively small contact holes 32 in the toplevel insulating layer 22. Provision of such small contact holes 32 in the toplevel insulating layer 22 over the capacitor 20 formed in the semiconductor integrated circuit will contribute to reduction in the quantity of the metal which may be caused to sink into the underlying polysilicon conductive layer 18 during the high-temperature process step to improve the ohmic contact between the conductive layer 18 and the metal layer 30. A semiconductor integrated circuit structure herein proposed will thus prove useful for avoiding the occurrence of an aluminum spike into the polysilicon conductive layer of the capacitor and accordingly for providing an increased throughput for the fabrication of a capacitor built-in semiconductor integrated circuit and enhanced reliability of operation of the capacitor incorporated into the integrated circuit structure.

The provision of small contact holes 32 in the toplevel insulating layer 22 over the capacitor 20 formed in a semiconductor integrated circuit according to the present invention is further advantageous for the prevention of the deterioration of the dielectric strength of the capacitor 20. This is because of the fact that the contact holes 32 in the insulating layer 22 are so small in cross section that only limited quantities of hydrofluoric are allowed to remain in the holes after fabrication of the circuit structure.

Figure 6:
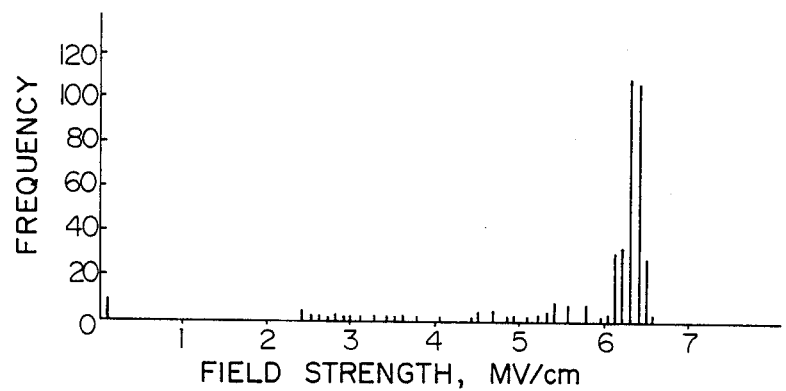
FIG. 6 is a schematic histogram representing the respective frequencies at which the dielectric strengths (indicated in terms of field strength) of capacitors are observed in semiconductor integrated circuits of the prior-art design.
Figure 7:
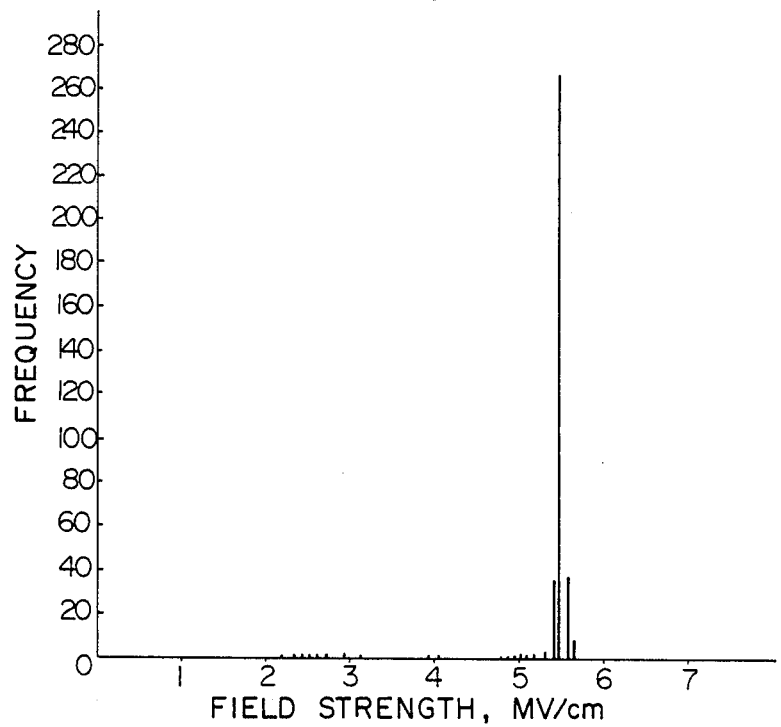
FIG. 7 is a histogram representing the respective frequencies at which the dielectric strengths (also indicated in terms of field strength) of capacitors are observed in semiconductor integrated circuits each fabricated in accordance with the present invention.

FIGS. 6 and 7 are schematic histograms which represent the respective frequencies at which the dielectric strengths of built-in capacitors incorporated in semiconductor integrated circuits occur each for the polulation of 420 samples. FIG. 6 shows such frequencies observed on capacitors fabricated in semiconductor integrated circuits of the prior-art design, while FIG. 7 shows such frequencies observed on capacitors forming part of semiconductor integrated circuits each fabricated in accordance with the present invention. In each of the histograms of FIGS. 6 and 7, the dielectric strengths are indicated in terms of field strengths in MV/cm on the axis of abscissa with the frequencies taken on the axis of ordinate. The dielectric layer (polysilicon oxide film 16) of each of the capacitors used for the measurement of the field strengths was formed by thermal oxidation of a polysilicon film at 1150° C. for 9 minutes in dry oxygen gas. As will be seen from FIG. 6, the capacitors fabricated in semiconductor integrated circuits of the prior-art design have low dielectric strengths observed at appreciable frequencies over a wide range of between about 6 MV/cm and about 2.5 MV/cm and even has a dielectric strength of zero volts to result in the occurrence of a short circuit between the electrodes. In the capacitors forming part of the semiconductor integrated circuits fabricated in accordance with the present invention, the dielectric strengths are somewhat lower than those of the capacitors of the prior-art semiconductor integrated circuits but are observed concentratedly over an extremely narrow range as will be seen from FIG. 7. This means that a semiconductor integrated circuit according to the present invention can be fabricated with a significantly increased yield of production.

While it has been described that a semiconductor integrated circuit structure is of the floating type fabricated on an oxide layer covering a silicon substrate, a semiconductor integrated circuit structure of a semiconductor integrated circuit according to the present invention may be fabricated with its lower conductive layer formed by the bulk of the substrate per se, although such an embodiment has not been illustrated.

What is claimed is:

1. A semiconductor integrated circuit comprising
   (a) a capacitor device including a first conductive layer on a semiconductor substrate, an insulating layer on the first conductive layer and a second conductive layer of polysilicon on the insulating layer,
   (b) an insulating layer covering said second conductive layer and being formed with a plurality of openings located within an area coextensive with said second conductive layer, each of said openings extending to and terminating at a surface of the second conductive layer, and
   (c) a metal layer formed on the insulating layer on said second conductive layer, the metal layer having portions respectively filling said openings and contacting said second conductive layer respectively through said openings, the individual portions of the metal layer being in common contact with said second conductive layer and forming part of one electrode of said capacitor device.

2. A semiconductor integrated circuit as set forth in claim 1, in which said openings in the insulating layer on said second conductive layer are distributed substantially uniformly over the insulating layer on said second conductive layer.

3. A semiconductor integrated circuit as set forth in claim 2, in which each of said openings in the insulating layer on said second conductive layer is generally square-shaped in cross section and per se measures in the range from about 1 by 1 square micron to about 4 by 4 square microns.

4. A semiconductor integrated circuit as set forth in claim 3, in which each of said openings in the insulating layer on said second conductive layer is provided within a generally square-shaped unit area measuring in the range from about 10 by 10 square microns to about 100 by 100 square microns.

5. A semiconductor integrated circuit comprising
(a) a semiconductor substrate,
(b) a relatively thick silicon oxide layer on the semiconductor substrate,
(c) a first conductive layer on said relatively thick silicon oxide layer,
(d) a dielectric layer on the first conductive layer,
(e) a second conductive layer of polysilicon on the dielectric layer, the first and second conductive layers forming part of a capacitor with said dielectric layer interposed therebetween,
(f) an insulator layer having a first portion on said second conductive layer and a second portion on said first conductive layer, said first portion of the insulator layer being formed with a plurality of contact holes located within an area coextensive with said second conductive layer, each of said contact holes extending to and terminating at a surface of the second conductive layer, said second portion of the insulator layer being formed with a single contact hole located outside said area coextensive with said second conductive layer, the contact hole in said second portion of the insulator layer extending to and terminating at a surface of said first conductive layer,
(g) a first metal layer formed on said insulator layer on said second conductive layer, the first metal layer having portions respectively filling said contact holes in said first portion of the insulator layer and contacting said second conductive layer respectively through the contact holes in the first portion of the insulator layer, and
(h) a second metal layer having a portion filling said single contact holes in said second portion of said insulator layer and contacting said first conductive layer through the single contact hole in the second portion of the insulator layer, and
(i) said portions of said first metal layer being in common contact with said second conductive layer and forming part of one plate of said capacitor and said portion of said second metal layer forming part of the other plate of the capacitor 6. A semiconductor integrated circuit as set forth in claim 5, in which said contact holes in said first portion of said insulator layer are distributed substantially uniformly over the first portion of the insulating layer, each of said contact holes in the first portion of the insulating layer being generally square-shaped in cross section and per se measuring in the range from about 1 by 1 square micron to about 4 by 4 square microns and being located within a generally square-shaped unit area measuring in the range from about 10 by 10 square microns to about 100 by 100 square microns.

* * * * *